United States Patent [19]
Kodaira

[11] Patent Number: 5,126,278
[45] Date of Patent: Jun. 30, 1992

[54] METHOD OF MANUFACTURING BIPOLAR TRANSISTOR BY IMPLANTING INTRINSIC IMPURITIES

[75] Inventor: Yasunobu Kodaira, Tokyo, Japan

[73] Assignee: Kabushiki Kaisha Toshiba, Kawasaki, Japan

[21] Appl. No.: 615,235

[22] Filed: Nov. 19, 1990

[30] Foreign Application Priority Data

Nov. 21, 1989 [JP] Japan ................... 1-302660

[51] Int. Cl.$^5$ ............... H01L 21/265; H01L 29/70
[52] U.S. Cl. ........................... 437/24; 437/31; 437/933; 437/950
[58] Field of Search ............ 437/24, 31, 450, 933; 148/DIG. 144, DIG. 18, DIG. 10

[56] References Cited

U.S. PATENT DOCUMENTS

| | | | |
|---|---|---|---|
| 4,589,936 | 5/1986 | Komatsu | 437/150 |
| 4,683,645 | 8/1987 | Naguib et al. | 437/24 |
| 4,746,964 | 5/1988 | Aronowitz | 357/63 |

Primary Examiner—Olik Chaudhuri
Assistant Examiner—Long Pham
Attorney, Agent, or Firm—Foley & Lardner

[57] ABSTRACT

A method of manufacturing a bipolar transistor, and more particularly to a method of manufacturing a bipolar transistor with reduced base width $W_B$ by implanting intrinsic impurities such as Ge and Sn in the base region.

21 Claims, 5 Drawing Sheets

METHOD OF MANUFACTURING BIPOLAR TRANSISTOR BY IMPLANTING INTRINSIC IMPURITIES

FIELD OF THE INVENTION

The present invention relates to a method of manufacturing a bipolar transistor, and more particularly to a method of manufacturing a bipolar transistor suitable for use with a semiconductor device necessary for high speed operation.

BACKGROUND OF THE INVENTION

Requests for improving the performance of a semiconductor device used in a computer become more and more crucial. Nowadays, there have been extensively used BiCMOS devices combining CMOS devices and bipolar transistors for the purpose of surmounting a speed limit of CMOS devices. High speed operation of BiCMOS devices is greatly influenced by the performance of associated bipolar transistors. It is very important to speed up bipolar transistors in order to improve the performance of BiCMOS devices.

FIGS. 1A to 1C show processes used for explaining the method of manufacturing a bipolar transistor of this type according to a background art, particularly a bipolar transistor of NPN type.

As shown in FIG. 1A, there are first formed within a silicon substrate 1 an N+ buried layer 2 for leading a collector electrode and a P+ buried layer 3 for element separation. Next, a silicon epitaxial layer 4 is grown within which an N-well 5 and P-well 6 are formed. Then, a field oxide film 7 is formed by an ordinary selective oxidation method for element separation. Thereafter, ions are implanted to form a deep N+ diffusion layer 8 and N++ diffusion layer 9 for leading the collector electrode, and a P++ diffusion layer 10 for leading a base electrode.

Next, as shown in FIG. 1B, a resist pattern 11 is formed. Using this resist pattern 11 as a mask, boron ions B are implanted as indicated at 12 to introduce base P− impurities 23 in a base-emitter SDG (source, drain, gate) area and to form a base.

Succeedingly, as shown in FIG. 1C, an SiO$_2$ film 18A is formed, for example, by a CVD method, and a hole 17A is formed at the area where an emitter is formed. Thereafter, a polysilicon 16 is deposited for forming an emitter by means of an LPCVD method (Low Pressure CVD method). Next, N-type impurities such as arsenic As are introduced within the polysilicon 16. The introduced impurities are diffused into the base-emitter SDG area to form an emitter 17. At the same time, the base P− impurities are also diffused to form a base (P−) 15b. Thereafter, an interlayer insulating film 18 such as SiO$_2$ is formed by a CVD method. Then, an emitter aluminum electrode 19, a base aluminum electrode 20, and collector aluminum electrode 21 are formed, and thereafter a passivation film 22 such as PSG is formed.

The above-described prior art method of forming a bipolar transistor is associated with the following problems with respect to realizing high speed operation. Namely, a bipolar transistor manufactured by the above-described method has a thick base width W$_B$ (refer to FIG. 1C), thereby hindering high speed operation. Such structure results from that the diffusion coefficient of boron B within silicon for forming the base (P−) 15b is several times as large as that of arsenic As for forming the emitter 17. As well known in the art, how fast a bipolar transistor operates is represented by a cut-off frequency F$_T$ which is inversely proportional to the square of the base width W$_B$. It is therefore very effective to make thin the base width W$_B$ in order to realize high speed operation of a bipolar transistor. However, the above-described manufacturing method poses a problem of a thick base width W$_B$.

SUMMARY OF THE INVENTION

The present invention aims at solving the above-described background problems and providing a bipolar transistor manufacturing method capable of making thin the base width W$_B$ of a bipolar transistor.

A method of manufacturing a bipolar transistor of this invention comprises the steps of:

(a) implanting first impurity ions of a second conductivity type for forming a second conductivity type impurity layer serving as a base, in a surface of a first conductivity type impurity layer serving as a collector at an area where the base and an emitter will be formed;

(b) implanting second impurity ions as an intrinsic semiconductor impurity, in a surface of the first conductivity type impurity layer at an area where the base and emitter will be formed, the second impurity ions suppress diffusion of the first impurity ions within the first conductivity type impurity layer;

(c) depositing an insulating film on the surface of the first conductivity type impurity layer at least at the area where the base and emitter will be formed;

(d) forming a hole in the insulating film at an area where the emitter will be formed;

(e) depositing a silicon layer at least on the surface of the first conductivity type impurity layer within the hole;

(f) introducing a first conductivity type impurity into the silicon layer;

(g) diffusing the first conductivity type impurity of the silicon layer into the first conductivity type impurity layer to form an emitter layer; and (h) diffusing the first and second impurity ions into the first conductivity type impurity layer, diffusion of the first impurity ions forming a base layer.

Although intrinsic semiconductor ions are used as the second impurity ions in the step (b), P− and N-type impurity ions having the same dose amount may be implanted to cancel out the conductivity types and to form an intrinsic semiconductor.

DESCRIPTION OF THE PREFERRED EMBODIMENTS

Embodiments of this invention will be described with reference to the accompanying drawings.

FIGS. 2A to 2D show processes of a method of manufacturing a bipolar transistor according to a first embodiment of this invention.

Figure 1A:
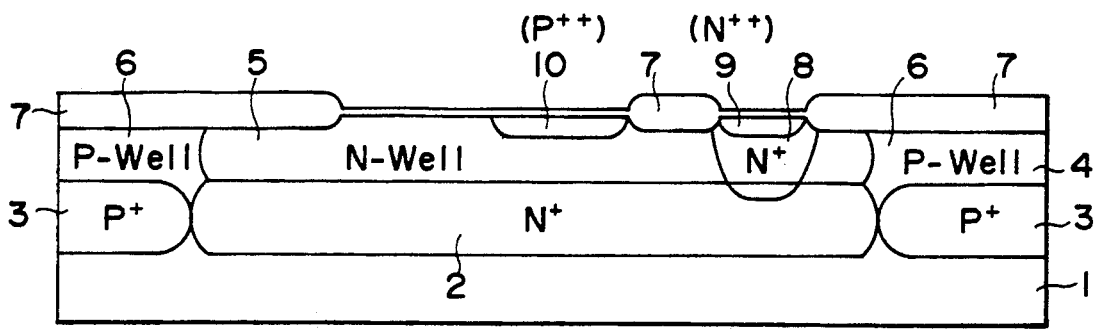
FIGS. 1A to 1C show processes of a method of manufacturing a bipolar transistor according to a background art.
Figure 1B:
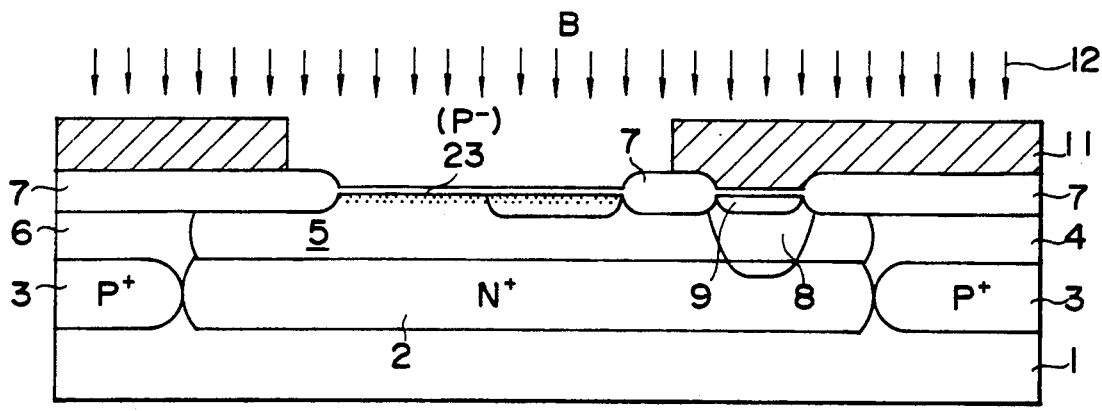
Figure 1C:
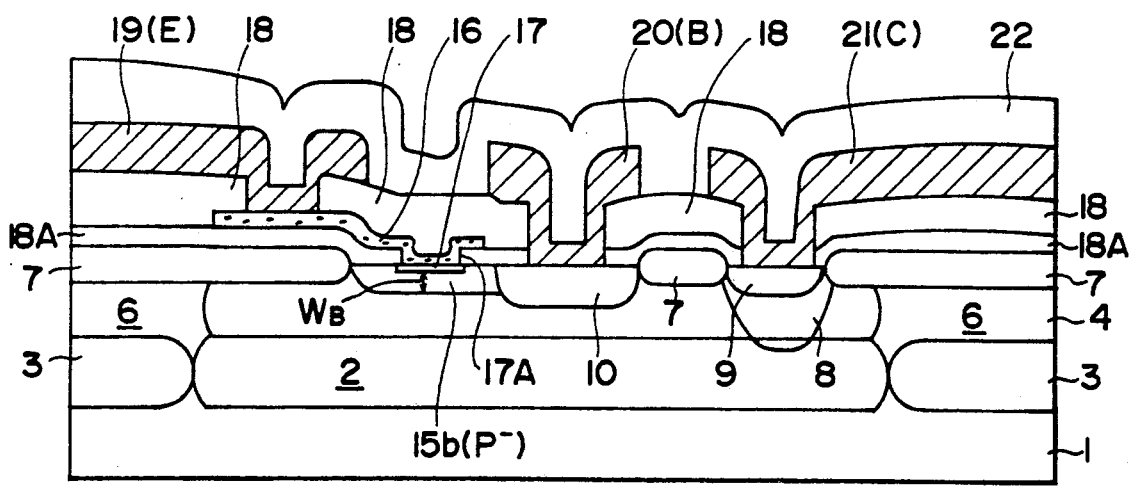
Figure 2A:
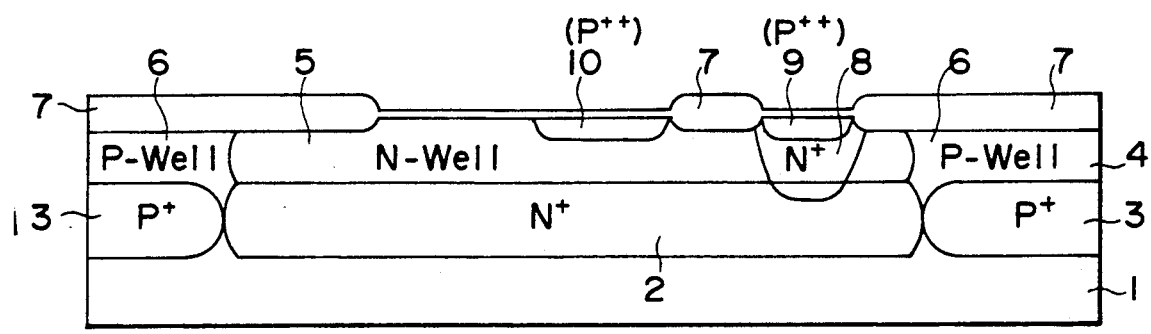
FIGS. 2A to 2D show processes of a method according to a first embodiment of this invention.

As shown in FIG. 2A, there are first formed within a silicon substrate 1 an N+ buried layer 2 for leading a collector electrode and a P+ buried layer 3 for element separation. Next, a silicon epitaxial layer 4 is grown within which an N-well 5 and P-well 6 are formed. Then, a field oxide film 7 is formed by an ordinary selective oxidation method for element separation. Thereafter, ions are implanted to form a deep N+ diffusion layer 8 and N++ diffusion layer 9 for leading the collector electrode, and a P++ diffusion layer 10 for leading a base electrode.

Figure 2B:
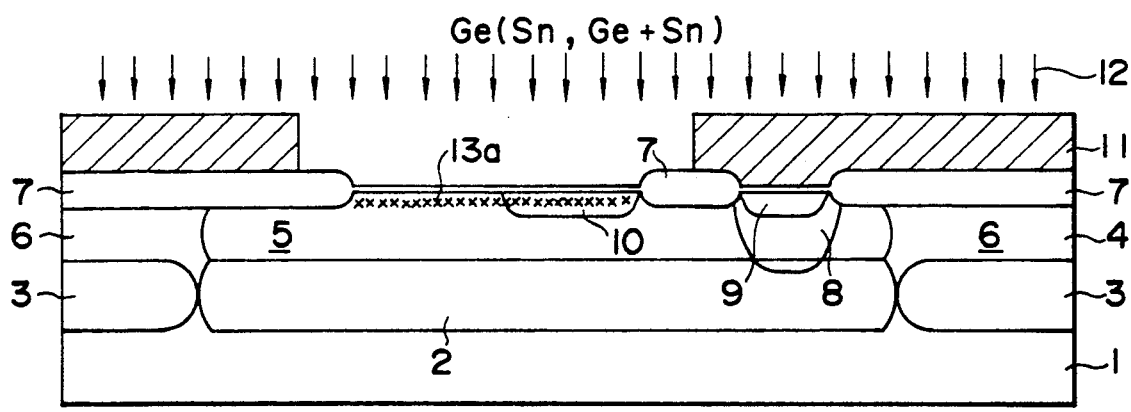

Next, as shown in FIG. 2B, a resist pattern 11 is formed. Using this resist pattern 11 as a mask, ions of germanium Ge, tin Sn, or both Ge and Sn are implanted as indicated at 12 to introduce intrinsic semiconductor impurities 13a in a base-emitter SDG area, for example, at an acceleration voltage 150 KeV and dose amount 2E13 cm$^{-2}$.

Figure 2C:
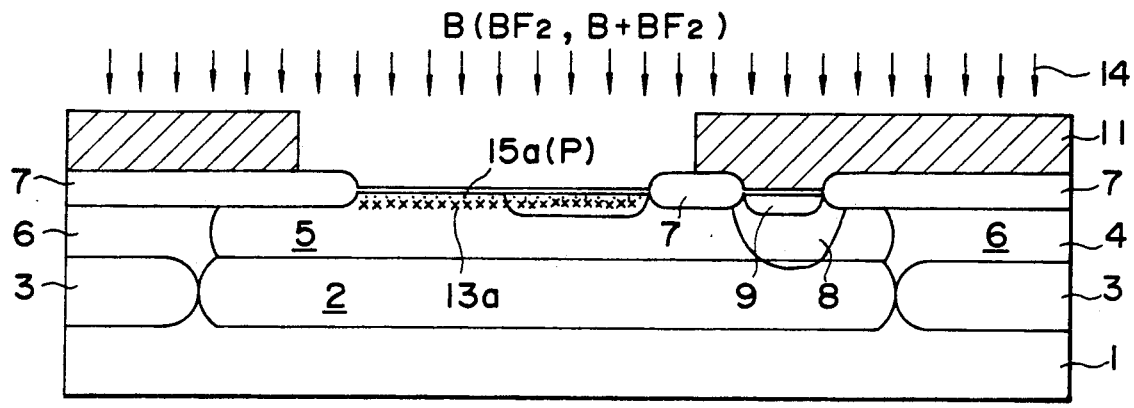

Succeedingly, as shown in FIG. 2C, using the resist pattern 11 as a mask, ions of boron B, boron fluoride BF$_2$, or both B and BF$_2$ are implanted as indicated at 14 to introduce P-type impurities into the base-emitter SDG area, for example, at an acceleration voltage 20 KeV and dose amount 2E13 cm$^{-2}$.

Figure 2D:
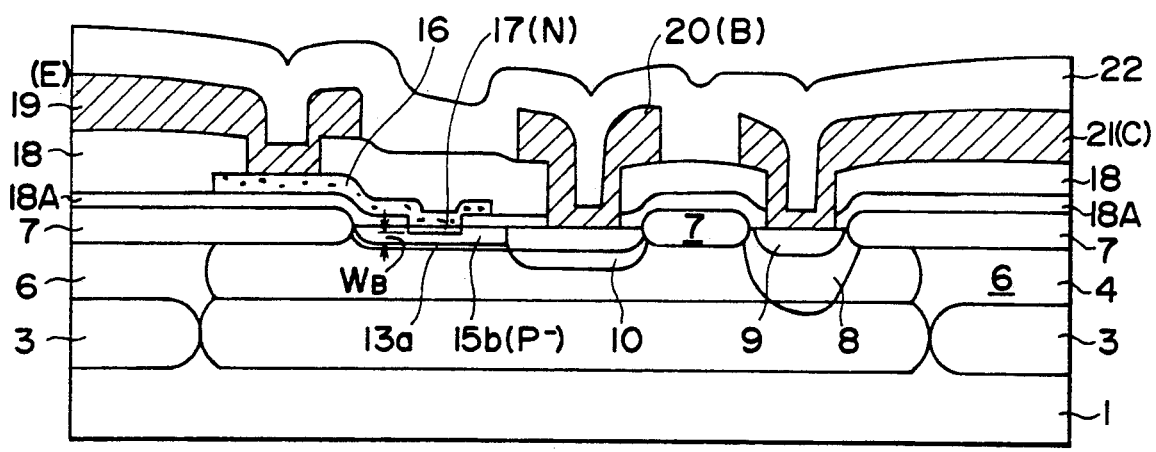

Next, as shown in FIG. 2D, in a similar manner to a conventional method, N-type impurities such as arsenic As are diffused from a polysilicon 16 to form an emitter 17. At the same time, the P-type impurities 15a are also diffused to form a base (P−) 15b. Thereafter, an interlayer insulating film 18 such as SiO$_2$ is formed by a CVD method. Then, an emitter aluminum electrode 19, a base aluminum electrode 20, and collector aluminum electrode 21 are formed, and thereafter a passivation film 22 such as PSG is formed to complete the bipolar transistor.

According to the above-described processes, not only ions of P-type impurities 15a but also intrinsic semiconductor impurities 13a such as germanium Ge, tin Sn, or both Ge and Sn are implanted in the area where the base is formed. The impurities 13a have a large atom radius and the diffusion speed within silicon of the impurities 13a is as slow as about one several-th of the base-type impurities such as boron B and boron fluoride BF$_2$. Therefore, diffusion within silicon of the P-type impurities 15a are suppressed, resulting in a bipolar transistor having a thin base width W$_B$. A bipolar transistor manufactured by the above processes is suitable for high speed operation.

In the above embodiment, after ions of the intrinsic semiconductor impurities such as germanium Ge or tin Sn are implanted, ions of P-type impurities 15a are implanted to form the base. However, opposite to the above, ions of the P-type impurities 15a may be implanted first to form the base, and then ions of the intrinsic semiconductor impurities 13a may be implanted, with the same advantageous effects being retained.

FIGS. 3A to 3E show processes of a method of manufacturing a bipolar transistor according to a second embodiment of this invention.

Figure 3A:
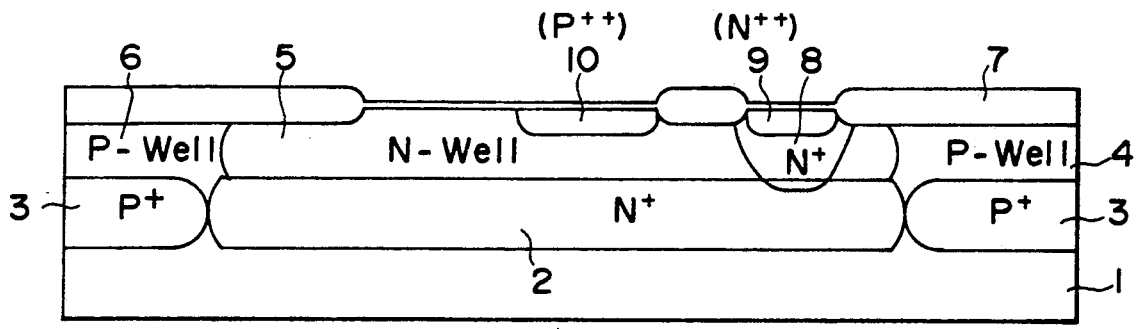
FIGS. 3A to 3E show processes of a method according to a second embodiment of this invention.

The bipolar semiconductor shown by the cross section of FIG. 3A is obtained by the same processes described with FIG. 2A.

Figure 3B:
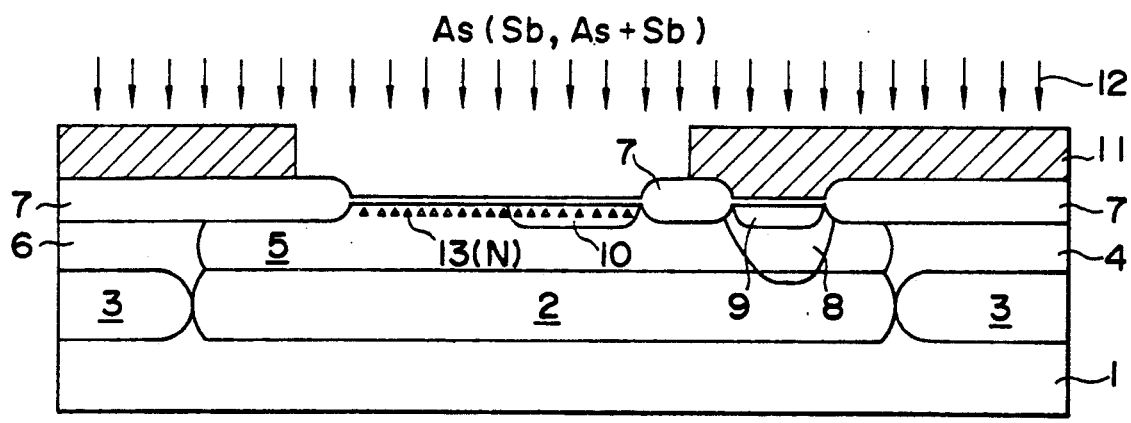

Next, as shown in FIG. 3B, a resist pattern 11 is formed. Using this resist pattern 11 as a mask, ions of arsenic As, antimony Sb, or both As and Sb as N-type impurities are implanted as indicated at 12 to introduce N-type impurities 13 in a base-emitter SDG area, for example, at an acceleration voltage 150 KeV and dose amount 1E13 cm$^{-2}$.

Figure 3C:
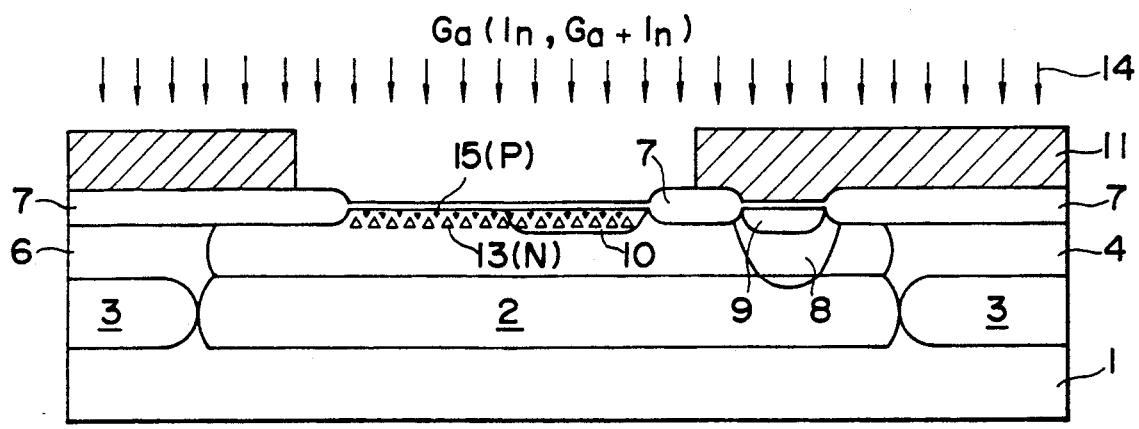

Succeedingly, as shown in FIG. 3C, using the resist pattern 11 as a mask, ions of gallium Ga, indium In, both Ga and In as P-type impurities are implanted as indicated at 14 to introduce P type impurities in the base emitter SDG area, for example, at an acceleration voltage 150 KeV and dose amount 1E13 cm$^{-2}$. In this case, the dose amount of P-type impurities is set to the same dose amount of N-type impurities previously implanted, so that P- and N-type impurities are canceled out to form an intrinsic semiconductor. The acceleration voltage is set such that the N-type and P-type impurities 13 and 15 come to the same depth.

Figure 3D:
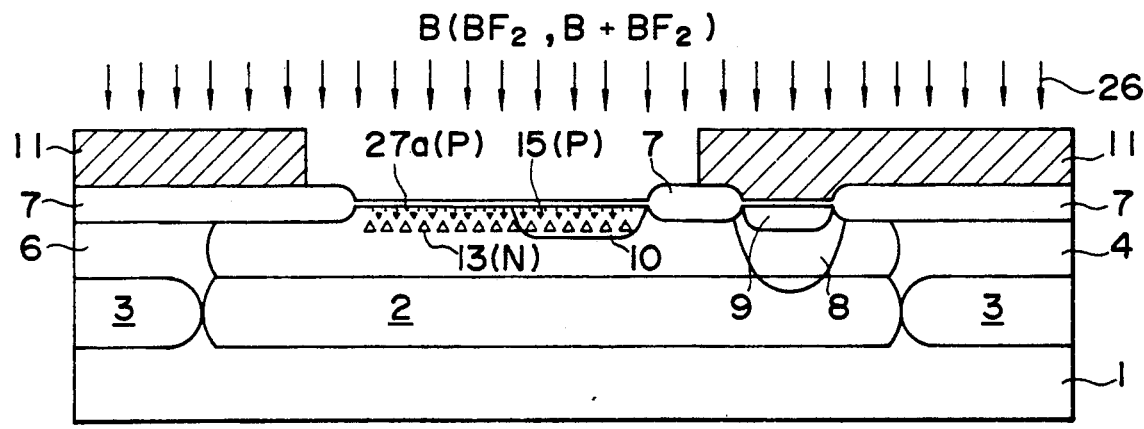

Next, as shown in FIG. 3D, using the resist pattern 11 as a mask, ions of boron B, boron fluoride BF$_2$, or both B and BF$_2$ are implanted as indicated at 26 to introduce P-type impurities 27a in the base-emitter SDG area for the purpose of forming a base, for example, at an acceleration voltage 20 KeV and dose amount 2E13 cm$^{-2}$.

Figure 3E:
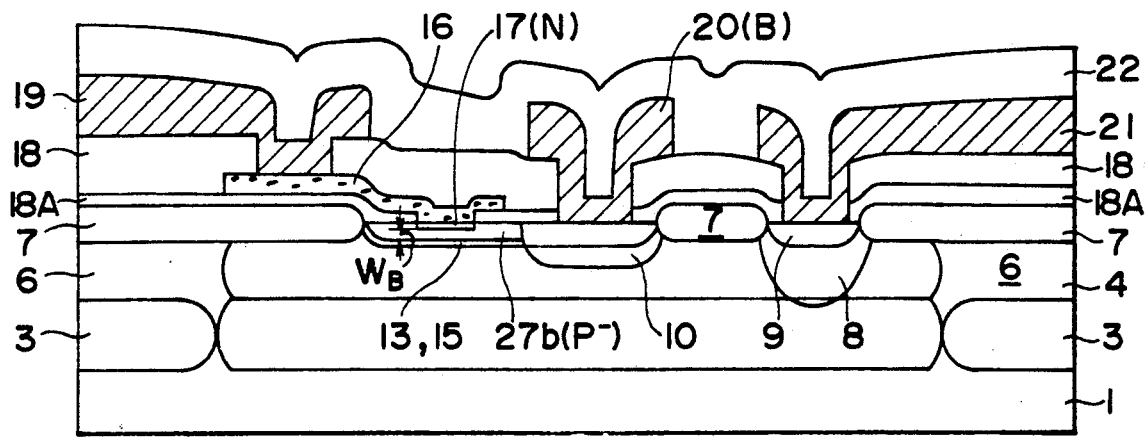

Thereafter, as shown in FIG. 3E, in a similar manner to the first embodiment, N-type impurities such as arsenic As are diffused from a polysilicon 16 to form an emitter 17. At the same time, the P-type impurities 27a are also diffused to form a base (P−) 27b. Thereafter, an interlayer insulating film 18 such as SiO$_2$ is formed by a CVD method. Then, an emitter aluminum electrode 19, a base aluminum electrode 20, and collector aluminum electrode 21 are formed, and thereafter a passivation film 22 such as PSG is formed to complete the bipolar transistor.

According to the above-described processes, in a similar manner to the processes shown in FIGS. 2A to 2D, a bipolar transistor can be obtained which has a thin base width W$_B$. Furthermore, since an intrinsic semiconductor is formed with the same dose amount of N- and P-type impurities, the breakdown voltage between the base and collector can be maintained high while preventing the breakdown voltage from becoming low even if the base width W$_B$ is made thin. A bipolar transistor obtained through the above-described processes is therefore suitable for high speed operation.

In the second embodiment, after implanting ions of arsenic As, antimony Sb and the like as N-type impurities and ions of gallium Ga and indium In as P-type impurities, ions of P-type impurities are implanted for forming the base. However, the order of implanting N- and P-type impurity ions and implanting P-type impurity ions may take any desired order. In this case also, a bipolar transistor having a thin base width W$_B$ can be obtained.

According to the embodiments of this invention, implanted in the area where the base is formed, are not only base forming P-type impurity ions, but also impurity ions having a larger atom radius such as germanium, tin, arsenic, antimony, gallium, indium or the like and having a diffusion speed within silicon as slow as about one several-th of that of the base forming P-type impurity such as boron. As a result, diffusion within silicon of the base forming P-type impurity is suppressed so that a bipolar transistor having a thin base width W$_B$ and high operation speed can be obtained. Furthermore, ions of the P-type impurities (gallium, indium and the like) are implanted by the dose amount same as that of the implanting N-type impurity ions such as arsenic, antimony and the like. As a result, a bipolar transistor having a thin base width W$_B$ and high operation speed can be obtained without lowering the breakdown voltage between the base and collector.

In the foregoing description, there has been described a method of manufacturing an NPN type bipolar transistor. It is also possible to manufacture a PNP type bipolar transistor in the similar manner. In this case, it is obvious that the conductivity type of impurities to be introduced is opposite.

What is claimed is:

1. A method of manufacturing a bipolar transistor comprising the steps of:
   (a) implanting first impurity ions of a second conductivity type for forming a second conductivity type impurity layer serving as a base, in a surface of a first conductivity type impurity layer serving as a collector at an area where the base and an emitter will be formed;
   (b) implanting second impurity ions as an intrinsic semiconductor impurity, in a surface of said first conductivity type impurity layer at an area where the base and emitter will be formed, said second impurity ions suppress diffusion of said first impurity ions within said first conductivity type impurity layer;
   (c) depositing an insulating film on the surface of said first conductivity type impurity layer at least at the area where the base and emitter will be formed;
   (d) forming a hole in said insulating film at an area where the emitter will be formed;
   (e) depositing a silicon layer at least on the surface of said first conductivity type impurity layer within said hole;
   (f) introducing a first conductivity type impurity into said silicon layer;
   (g) diffusing said first conductivity type impurity of said silicon layer into said first conductivity type impurity layer to form an emitter layer; and
   (h) diffusing said first and second impurity ions into said first conductivity type impurity layer, diffusion of said first impurity ions forming a base layer.

2. A method according to claim 1, wherein said step (b) is executed after said step (a).

3. A method according to claim 1, wherein said step (a) is executed after said step (b).

4. A method according to claim 1, wherein the atom radius of said second impurity ions is larger than that of said first impurity ions, and in said first conductivity type impurity layer, the diffusion speed of said second impurity ions is slower than that of said first impurity ions.

5. A method according to claim 4, wherein in said step (a) said first impurity ions are selected from the group consisting of boron, boron fluoride, and both boron and boron fluoride, and in said step (b) said second impurity ions are selected from the group consisting of germanium, tin, and both germanium and tin.

6. A method according to claim 5, wherein said first impurity ions are implanted at an acceleration voltage 150 KeV and dose amount $2E13\ cm^{-2}$, and said second impurity ions are implanted at an acceleration voltage 20 KeV and dose amount $2E13\ cm^{-2}$.

7. A method according to claim 1, wherein said steps (g) and (h) are executed at the same time.

8. A method according to claim 4, wherein said steps (g) and (h) are executed at the same time.

9. A method according to claim 5, wherein said steps (g) and (h) are executed at the same time.

10. A method of manufacturing a bipolar transistor comprising the steps of:
    (a) implanting first impurity ions of a second conductivity type for forming a second conductivity type impurity layer serving as a base, in a surface of a first conductivity type impurity layer serving as a collector at an area where the base and an emitter will be formed;
    (b) implanting P-type ions in a surface of said first conductivity type impurity layer at an area where the base and emitter will be formed, said P-type impurity ions suppress diffusion of said first impurity ions within said first conductivity type impurity layer;
    (c) implanting N-type impurity ions in the surface of said first conductivity type impurity layer at the area where the base and emitter area will be formed, said N-type impurity ions suppress diffusion of first impurity ions within said first conductivity type impurity layer, said N-type impurity ions being implanted by the amount same as said P-type impurity ions, and said P- and N-type impurity ions canceling out the respective conductivity types;
    (d) depositing an insulating film on the surface of said first conductivity type impurity layer at least at the area where the base and emitter will be formed;
    (e) forming a hole in said insulating film at an area where the emitter will be formed;
    (f) depositing a silicon layer at least on the surface of said first conductivity type impurity layer within said hole;
    (g) introducing a first conductivity type impurity into said silicon layer;
    (h) diffusing said first conductivity type impurity of said silicon layer into said first conductivity type impurity layer to form an emitter layer; and
    (i) diffusing said P- and N-type impurity ions into said first conductivity type impurity layer, diffusion of said first impurity ions forming a base layer.

11. A method according to claim 10, wherein the atom radius of said P- and N-type impurity ions is larger than that of said first impurity ions, and in said first conductivity type impurity layer, the diffusion speed of said P- and N-type impurity ions is slower than that of said first impurity ions.

12. A method according to claim 11, wherein said P-type impurity ions are selected from the group consisting of gallium, indium, and both gallium and indium, said N-type impurity ions are selected from the group consisting of arsenic, antimony, and both arsenic and antimony, and said first impurity ions are selected from the group consisting of boron, boron fluoride, and both boron and boron fluoride.

13. A method according to claim 12, wherein said P- and N-type impurity ions are implanted at an acceleration voltage 150 KeV and dose amount $1E13\ cm^{-2}$, and said first impurity ions are implanted at an acceleration voltage 20 KeV and dose amount $2E13\ cm^{-2}$.

14. A method according to claim 10, wherein said steps (h) and (i) are executed at the same time.

15. A method according to claim 11, wherein said steps (h) and (i) are executed at the same time.

16. A method according to claim 12, wherein said steps (h) and (i) are executed at the same time.

17. A method according to claim 10, wherein said steps (c), (b) and (a) are executed in this order as recited.

18. A method according to claim 11, wherein said steps (c), (b) and (a) are executed in this order as recited.

19. A method according to claim 12, wherein said steps (c), (b) and (a) are executed in this order as recited.

20. A method according to claim 14, wherein said steps (c), (b) and (a) are executed in this order as recited.

21. A method according to claim 5, wherein in said step (b) said second impurity ions are selected from the group consisting of tin, and mixtures of germanium and tin.

* * * * *